US012772801B2

(12) United States Patent
Choi et al.

(10) Patent No.: US 12,772,801 B2
(45) Date of Patent: Oct. 20, 2026

(54) MICROWAVE HEATING DEVICE AND METHOD FOR MANUFACTURING SEMICONDUCTOR PACKAGING USING THE SAME

(71) Applicant: Electronics and Telecommunications Research Institute, Daejeon (KR)

(72) Inventors: Gwang-Mun Choi, Daejeon (KR); Yong Sung Eom, Daejeon (KR); Jiho Joo, Daejeon (KR); Kwang-Seong Choi, Daejeon (KR); Seok-Hwan Moon, Daejeon (KR); Jin Hyuk Oh, Daejeon (KR); Ho-Gyeong Yun, Daejeon (KR); Chanmi Lee, Daejeon (KR); Ki Seok Jang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 866 days.

(21) Appl. No.: 18/297,461

(22) Filed: Apr. 7, 2023

(65) Prior Publication Data

US 2023/0326810 A1 Oct. 12, 2023

(30) Foreign Application Priority Data

Apr. 8, 2022 (KR) ........................ 10-2022-0044036
Mar. 29, 2023 (KR) ........................ 10-2023-0041523

(51) Int. Cl.
*H10P 74/00* (2026.01)
*H05B 6/64* (2006.01)
*H10W 74/01* (2026.01)

(52) U.S. Cl.
CPC ............. *H10P 74/23* (2026.01); *H05B 6/645* (2013.01); *H05B 6/6491* (2013.01); *H10W 74/016* (2026.01)

(58) Field of Classification Search
CPC ........ H05B 6/68; H05B 6/645; H05B 6/6455; H10W 74/016; H10P 74/23; H10P 72/0436; H10P 72/0602
See application file for complete search history.

(56) References Cited

U.S. PATENT DOCUMENTS 10,660,166 B2 5/2020 Jung et al.
2012/0112839 A1 5/2012 Noh
(Continued)

FOREIGN PATENT DOCUMENTS

JP 2005-55162 3/2005
JP 2005-331158 12/2005
(Continued)

*Primary Examiner* — Courtney D Heinle
*Assistant Examiner* — Andrew Thanh Bui
(74) *Attorney, Agent, or Firm* — KILE PARK REED & HOUTTEMAN PLLC

(57) ABSTRACT

Provided are a microwave heating device and a method for manufacturing a semiconductor packaging using the same. The microwave heating device includes a microwave generator configured to generate microwaves, a microwave absorbing layer configured to receive the microwaves so as to be heated, a temperature measuring layer provided on the microwave absorbing layer, a sensor configured to detect a temperature of the temperature measuring layer, and a controller connected to the sensor and the microwave generator to determine the temperature of the microwave absorbing layer using a detection signal of the sensor, the controller being configured to control a voltage of the microwaves provided from the microwave generator based on the temperature of the microwave absorbing layer.

12 Claims, 6 Drawing Sheets

(56) References Cited

U.S. PATENT DOCUMENTS

| | | | | |
|---|---|---|---|---|
| 2014/0042152 | A1 * | 2/2014 | Hu | H05B 6/806 219/679 |
| 2015/0181654 | A1 | 6/2015 | Feilders et al. | |
| 2015/0238113 | A1 | 8/2015 | Son et al. | |
| 2018/0323091 | A1 * | 11/2018 | Rao | H05B 6/6402 |
| 2021/0001520 | A1 * | 1/2021 | Koh | B29C 35/0805 |

FOREIGN PATENT DOCUMENTS

| | | |
|---|---|---|
| JP | 2010-123738 | 6/2010 |
| KR | 10-1387661 | 4/2014 |
| KR | 10-1536895 | 7/2015 |
| KR | 10-1609680 | 4/2016 |
| WO | 2017/073563 | 5/2017 |

* cited by examiner

MICROWAVE HEATING DEVICE AND METHOD FOR MANUFACTURING SEMICONDUCTOR PACKAGING USING THE SAME

CROSS-REFERENCE TO RELATED APPLICATIONS

This U.S. non-provisional patent application claims priority under 35 U.S.C. § 119 of Korean Patent Application No. 10-2022-0044036, filed on Apr. 8, 2022, No. 10-2023-0041523, field on Mar. 29, 2023, the entire contents of which are hereby incorporated by reference.

BACKGROUND

The present disclosure herein relates to a microwave heating device, and more particularly, to a microwave heating device for packaging a semiconductor element and a method for manufacturing a semiconductor packaging using the same.

In the existing semiconductor packaging, a long-term process is performed at a high temperature to harden a material, but process defects due to warpage of a semiconductor are increasing due to large power consumption and a difference in thermal expansion coefficient between different materials constituting the semiconductor packaging. To solve this limitation, semiconductor packaging materials and process technologies using microwaves are being developed to replace the existing thermal process. In microwave-curable materials, a polymer material directly absorbs microwaves to perform curing by rotation and frictional heat of molecules. However, there is a limitation in that an absolute volume of the material capable of actually absorbing the microwaves is reduced due to lightweight, thin, slim, and miniaturization of the semiconductor packaging, and thus, a heat conversion rate is rapidly lowered. In addition, in the case of typical microwave processing devices, a process may be performed only for a specific shape and sample according to microwave frequencies, and thus, it is difficult to universally apply this process to the existing semiconductor packaging.

SUMMARY

The present disclosure provides a microwave heating device capable of effectively heating a semiconductor packaging and a method for manufacturing a semiconductor packaging using the same.

An embodiment of the inventive concept provides a microwave heating device. In an embodiment, the microwave heating device includes: a microwave generator configured to generate microwaves; a microwave absorbing layer configured to receive the microwaves so as to be heated; a temperature measuring layer provided on the microwave absorbing layer; a sensor provided on and inside the temperature measuring layer to detect a temperature of the temperature measuring layer; and a controller connected to the sensor and the microwave generator to determine the temperature of the microwave absorbing layer using a detection signal of the sensor, the controller being configured to control power of the microwaves provided from the microwave generator based on the temperature of the microwave absorbing layer.

In an embodiment, the microwave heating device may further include a thermal interface layer between the microwave absorbing layer and the temperature measuring layer.

In an embodiment, the thermal interface layer may include a thermal interface material.

In an embodiment, the microwave absorbing layer may include: a highly heat-resistant polymer; and microwave absorbing particles within the highly heat-resistant polymer.

In an embodiment, the microwave absorbing layer may further include: a microwave-transmissive container configured to store the microwave absorbing particles; and a highly heat-resistant resin provided within the microwave-transmissive container.

In an embodiment, the microwave absorbing particles may include graphene, SWCNT, MWCNT, fullerene, BN, or BNNT.

In an embodiment, the microwave absorbing layer may include a microwave metamaterial absorber.

In an embodiment, the microwave absorbing layer may include: a lower microwave absorbing layer; and an upper microwave absorbing layer on the lower microwave absorbing layer.

In an embodiment, the lower microwave absorbing layer may include: a first lower microwave absorbing layer; a second lower microwave absorbing layer provided at one side of the first lower microwave absorbing layer, the second lower microwave absorbing layer having a thermal conversion rate different from a thermal conversion rate of the first lower microwave absorbing layer; and a third lower microwave absorbing layer provided at the other side of the first lower microwave absorbing layer, the third lower microwave absorbing layer having a thermal conversion rate different from each of the thermal conversion rates of the first and second lower microwave absorbing layers.

In an embodiment, the upper microwave absorbing layer may include: a first upper microwave absorbing layer; a second upper microwave absorbing layer provided at one side of the first lower microwave absorbing layer, the second upper microwave absorbing layer having a thermal conversion rate different from a thermal conversion rate of the first upper microwave absorbing layer; and a third upper microwave absorbing layer provided at the other side of the first lower microwave absorbing layer, the third upper microwave absorbing layer having a thermal conversion rate different from each of the thermal conversion rates of the first and second upper microwave absorbing layers.

In an embodiment of the inventive concept, a method for manufacturing a semiconductor packaging includes: manufacturing a semiconductor element; and heating the semiconductor element using a microwave heating device. In an embodiment, the microwave heating device may include: a microwave generator configured to generate microwaves; a microwave absorbing layer configured to receive the microwaves so as to be heated; a temperature measuring layer provided on the microwave absorbing layer; a sensor provided on and inside the temperature measuring layer to detect a temperature of the temperature measuring layer; and a controller connected to the sensor and the microwave generator to determine the temperature of the microwave absorbing layer using a detection signal of the sensor, the controller being configured to control power of the microwaves provided from the microwave generator based on the temperature of the microwave absorbing layer.

In an embodiment, the method may further include forming a mold layer on an outer circumferential surface of the semiconductor element, wherein the heating of the semiconductor element may include curing the mold layer.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
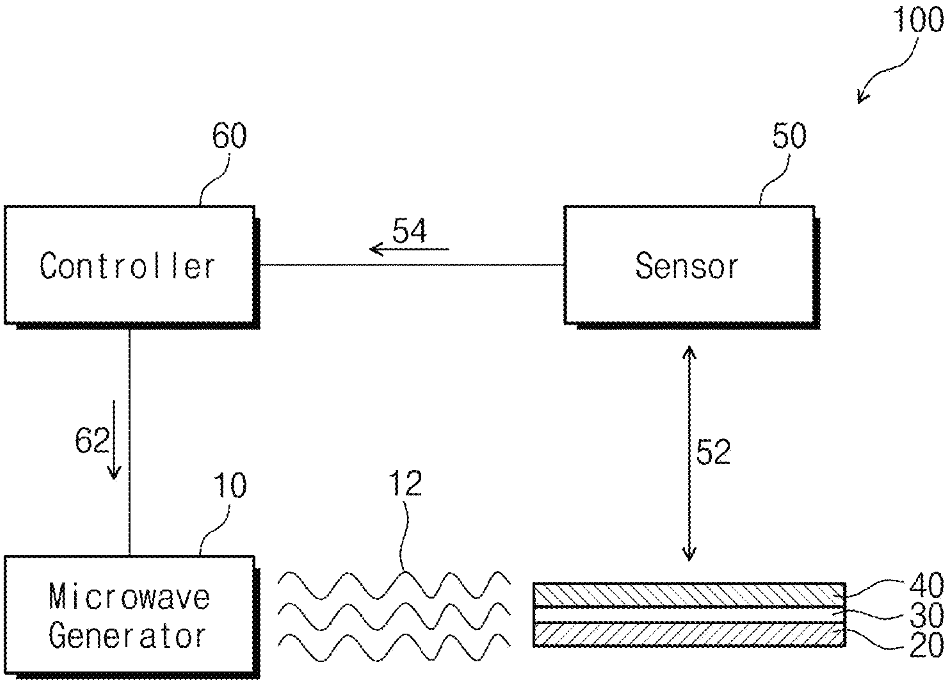
FIG. 1 is a view illustrating an example of a microwave heating device according to the inventive concept.

Preferred embodiments of the present invention will be described below in detail with reference to the accompanying drawings. Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art, and the present invention is only defined by the scope of the claims. Like reference numerals refer to like elements throughout.

In the following description, the technical terms are used only for explaining a specific exemplary embodiment while not limiting the present invention. In this specification, the terms of a singular form may comprise plural forms unless specifically mentioned. The meaning of 'comprises' and/or 'comprising' specifies a component, an operation and/or an element does not exclude other components, operations and/or elements. Since preferred embodiments are provided below, the order of the reference numerals given in the description is not limited thereto.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes.

FIG. 1 is a view illustrating an example of a microwave heating device 100 according to the inventive concept.

Referring to FIG. 1, the microwave heating device 100 according to the invention concept may include a microwave generator 10, a microwave absorbing layer 20, a thermal interface layer 30, a temperature measuring layer 40, a sensor 50, and a controller 60.

The microwave generator 10 may generate microwaves 12 using a voltage 62. The microwaves 12 may have a frequency of about 0.3 GHz to about 1,000 GHz and a wavelength of about 1 mm to about 1 m. The frequency of the microwaves generated by the microwave generator may be fixed or variable.

The microwave absorbing layer 20 may receive the microwaves 12 and be heated. The microwave absorbing layer 20 may have a flat plate shape.

Figure 2A:
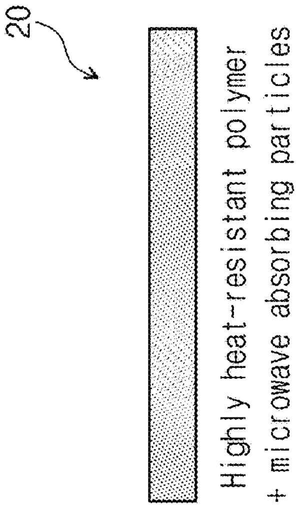
FIGS. 2A to 2C are cross-sectional views illustrating examples of a microwave absorbing layer of FIG. 1.
Figure 2B:
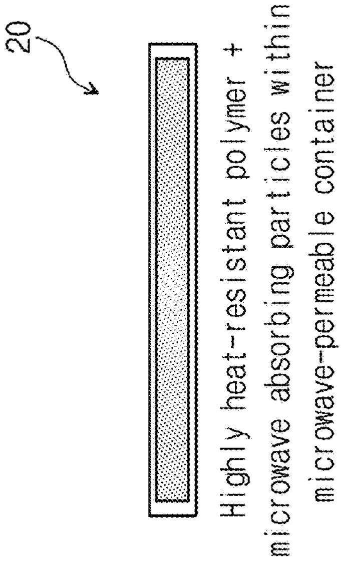
Figure 2C:
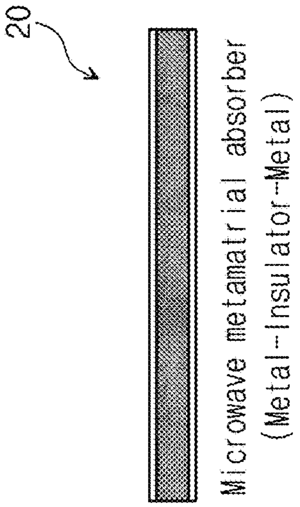

FIGS. 2A to 2C are cross-sectional views illustrating examples of the microwave absorbing layer 20 of FIG. 1.

Referring to FIG. 2A, the microwave absorbing layer 20 may include a highly heat-resistant polymer and microwave absorbing particles.

The highly heat-resistant polymer may fix the microwave absorbing particles. The highly heat-resistant polymer may emit heat generated by the microwave absorbing particles to the outside. The highly heat-resistant polymer may not be melted by the heat of the microwave absorbing particles. That is, the highly heat-resistant polymer may protect the microwave absorbing particles from the heat. For example, the highly heat-resistant polymer may include PEEK, PPS, PEI, PVDF, PES, PI, PPSU, PSU, PTFE, and PDMS.

The microwave absorbing particles may be provided in the highly heat-resistant polymer. The microwave absorbing particles may be uniformly arranged in the highly heat-resistant polymer. The microwave absorbing particles may absorb the microwaves 12 and be heated. For example, the microwave absorbing particles may include graphene, SWCNT, MWCNT, fullerene, BN, BNNT, and wire. The microwave absorbing particles may include various materials having a large aspect ratio, but the embodiment of the inventive concept is not limited thereto.

Referring to FIG. 2B, the microwave absorbing layer 20 may include a microwave-transmissive container, a highly heat-resistant resin, and microwave absorbing particles.

The microwave-transmissive container may store the highly heat-resistant resin and the microwave absorbing particles. The microwave-transmissive container may allow the microwaves 12 to be permeable. For example, the microwave-transmissive container may include glass. Alternatively, the microwave-transmissive container may include silicone or plastic, but the embodiment of the inventive concept is not limited thereto.

The highly heat-resistant resin may be provided in the microwave-transmissive container. The highly heat-resistant resin may disperse the microwave absorbing particles and dissipate the heat generated from the microwave absorbing particles to the outside. The highly heat-resistant resin may include silicone oil.

The microwave absorbing particles may be provided in the microwave-transmissive container and the highly heat-resistant resin.

Referring to FIG. 2C, the microwave absorbing layer 20 may include a microwave metamaterial absorber. For example, the microwave absorbing layer 20 may include a metal-insulator-metal.

Referring again to FIG. 1, the thermal interface layer 30 may be provided on the microwave absorbing layer 20. The thermal interface layer 30 may physically or thermally connect the microwave absorbing layer 20 to the temperature measuring layer 40. The thermal interface layer 30 may include thermal interface materials (TIM). For example, the thermal interface layer 30 may include a conductive adhesive layer.

The temperature measuring layer 40 may be provided on the thermal interface layer 30. The temperature measuring layer 40 may have thermal emissivity of about 0.9 or more, but the embodiment of the inventive concept is not limited thereto.

The temperature measuring layer 40 and the thermal interface layer 30 may be selectively present at specific positions on the microwave absorbing layer 20. When two or more identical microwave absorbing layers 20 are arranged to be used, the temperature measuring layer 40 and the thermal interface layer 30 may be present on one microwave absorbing layer 20. For example, when two identical microwave absorbing layers 20 are used, the temperature measuring layer 40 and the thermal interface layer 30 may be present on one microwave absorbing layer 20 and may not be present on the other microwave absorbing layer 20. In addition, when the microwave absorbing layer 20 simultaneously performs the function of the temperature measuring layer 40, the microwave heating device 100 may be provided as only the microwave absorbing layer 20.

The sensor 50 may be provided on or inside the temperature measuring layer 40. The sensor 50 may detect infrared rays 52 of the temperature measuring layer 40. The sensor 50 may include an infrared sensor. The sensor 50 may include a contact temperature sensor. The contact temperature sensor may be used without limitation as long as the contact temperature sensor performs a role of measuring a temperature to provide the measured temperature to the controller, such as a thermocouple, RTD, or a thermistor.

The controller 60 may be connected to the microwave generator 10 and the sensor 50. The controller 60 may control a voltage 62 provided to the microwave generator 10. The controller 60 may determine the temperatures of the microwave absorbing layer 20 and the temperature measuring layer 40 using a detection signal 54 of the sensor 50. The controller 60 may compare the temperature of the microwave absorbing layer 20 with a predetermined temperature to adjust the voltage 62 of the microwave generator 10 in real time.

Figure 3:
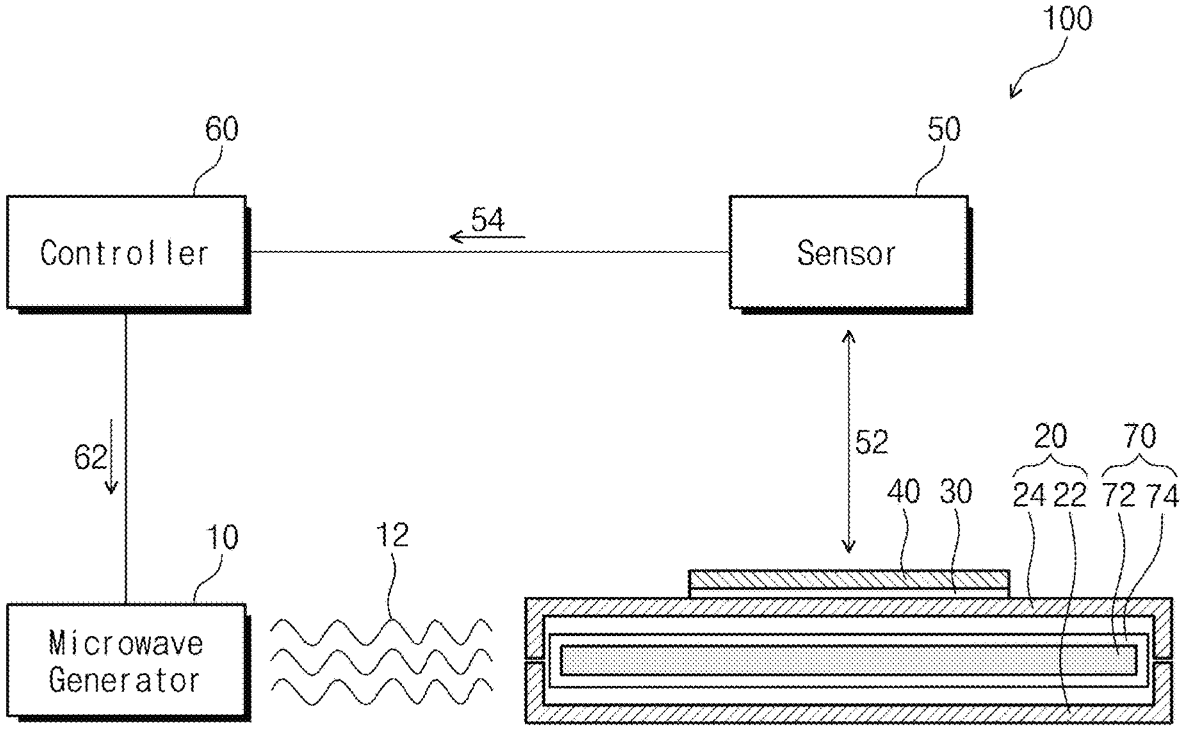
FIG. 3 is a view illustrating an example of the microwave heating device according to the inventive concept.

FIG. 3 is a view illustrating an example of the microwave heating device 100 according to the inventive concept.

Referring to FIG. 3, the microwave absorbing layer 20 of the microwave heating device 100 according to the inventive concept may surround a semiconductor packaging 70. The microwave generator 10, the thermal interface layer 30, the temperature measuring layer 40, the sensor 50, and the controller 60 may be configured in the same manner as in FIG. 1. The microwave absorbing layer 20 may heat a front surface of the semiconductor packaging 70. The semiconductor packaging 70 may include a semiconductor element 72 and a mold layer 74 surrounding the semiconductor element 72.

According to one example, the microwave absorbing layer 20 may include a lower microwave absorbing layer 22 and an upper microwave absorbing layer 24. The lower microwave absorbing layer 22 may accommodate the semiconductor packaging 70. The semiconductor packaging 70 may be provided within the lower microwave absorbing layer 22. The upper microwave absorbing layer 24 may be provided on the lower microwave absorbing layer 22 and the semiconductor packaging 70. The lower microwave absorbing layer 22 and the upper microwave absorbing layer 24 may heat a lower portion, an upper portion, side surfaces of the semiconductor packaging 70.

Figure 4:
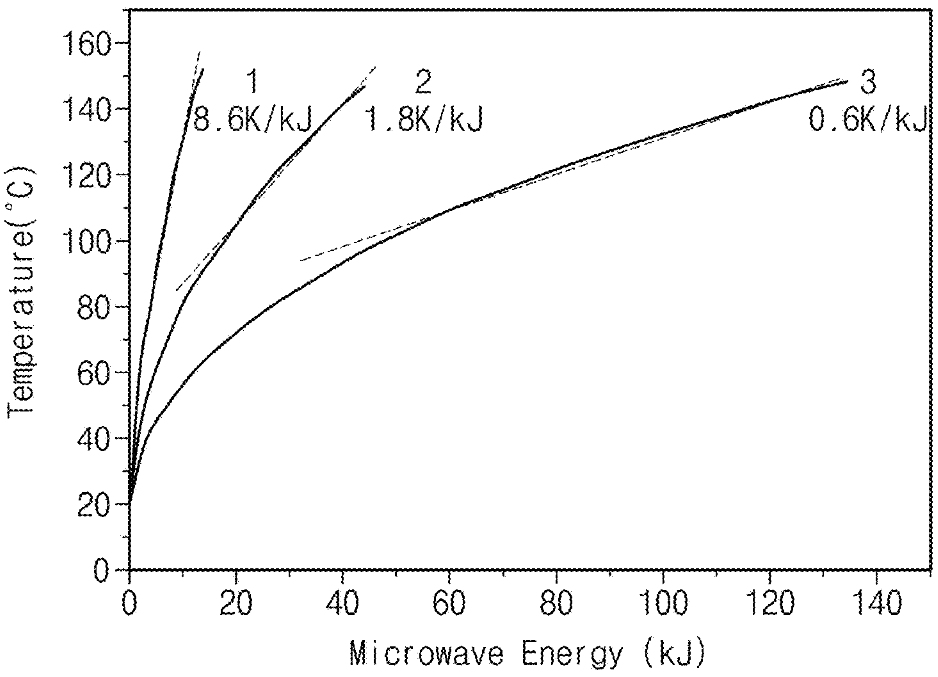
FIG. 4 is graphs illustrating a heat conversion rate of the microwave absorbing layer of FIG. 1.

FIG. 4 is graphs illustrating a heat conversion rate of the microwave absorption layer 20 of FIG. 1.

Referring to FIGS. 1 and 4, the microwave absorbing layer 20 may have various heat conversion rates depending on its material. For example, the microwave absorbing layer 20 may have a first heat conversion rate 1, a second heat conversion rate 2, and a third heat conversion rate 3.

The first heat conversion rate 1 may be greater than each of the second heat conversion rate 2 and the third heat conversion rate 3. The first heat conversion rate 1 may be about 8.6 K/kJ. When the microwaves 12 are constant, the microwave absorbing layer 20 having the first heat conversion rate 1 may be heated faster than the microwave absorbing layer 20 having each of the second heat conversion rate 2 and the third heat conversion rate. The second heat conversion rate 2 may be less than each of the first heat conversion rate 1 and greater than the third heat conversion rate 3. The second heat conversion rate 2 may be about 1.8 K/kJ. The third heat conversion rate 3 may be less than each of the first heat conversion rate 1 and the second heat conversion rate 2. The third heat conversion rate 3 may be about 0.6 K/kJ. The microwave absorbing layer 20 having the third heat conversion rate 3 may be heated more slowly than the microwave absorbing layer 20 having each of the first heat conversion rate 1 and the second heat conversion rate 2.

Figure 5:
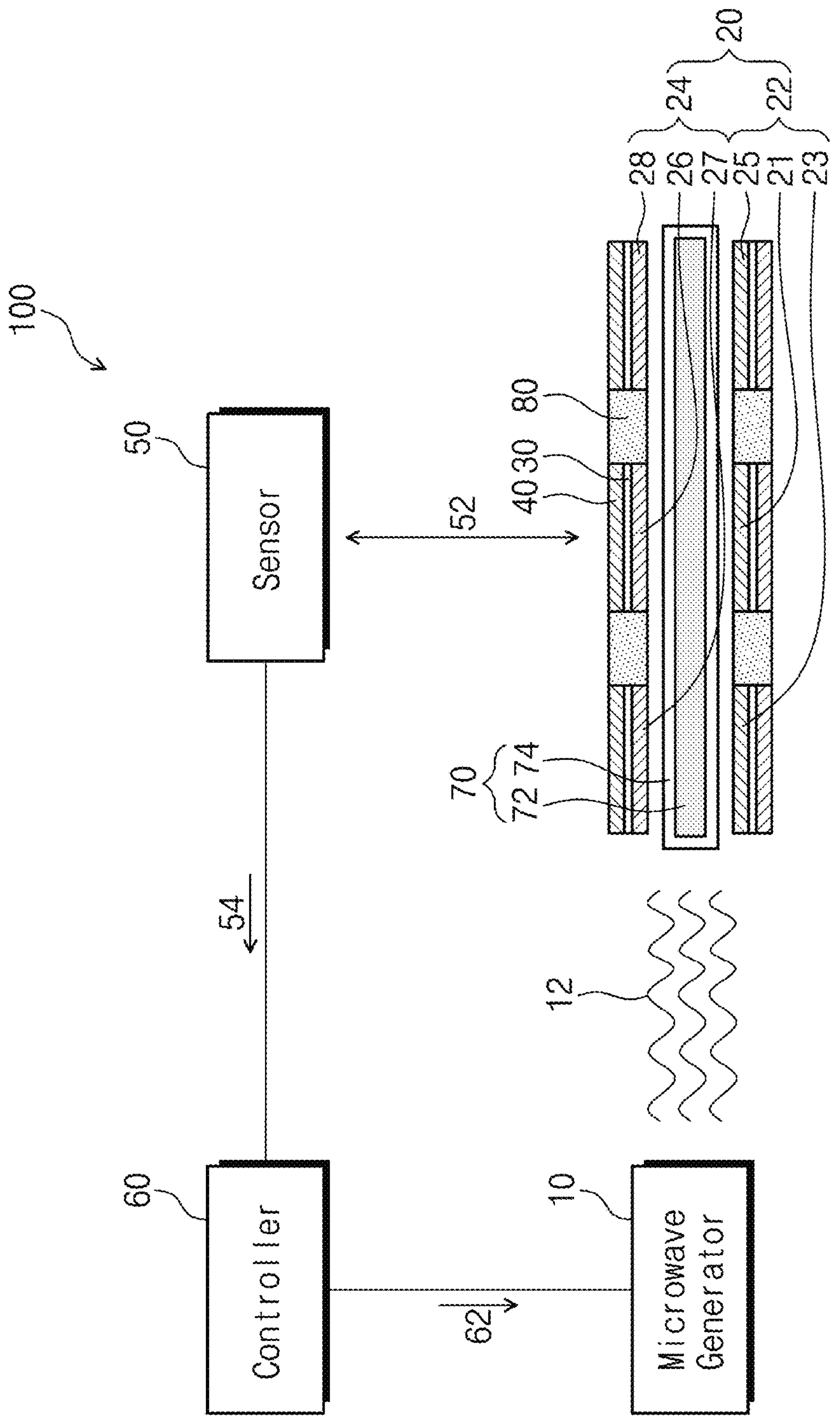
FIG. 5 is a view illustrating an example of the microwave heating device according to the inventive concept.

FIG. 5 is a view illustrating an example of the microwave heating device 100 according to the inventive concept.

Referring to FIG. 5, the lower microwave absorbing layers 22 and the upper microwave absorbing layers 24 of the microwave absorbing layer 20 may receive the microwaves 12 to heat the lower and upper portions of the semiconductor packaging 70. The lower microwave absorbing layers 22 and the upper microwave absorbing layers 24 may be individually separated from each other by adiabatic connections 80. The adiabatic connections 80 physically connect the microwave absorbing layers 20, but may thermally block the microwave absorbing layers 20.

According to an example, the lower microwave absorbing layers 22 may include a first lower microwave absorbing layer 21, a second lower microwave absorbing layer 23, and a third lower microwave absorbing layer 25.

The first lower microwave absorbing layer 21 may be provided between the second lower microwave absorbing layer 23 and the third lower microwave absorbing layer 25. The second lower microwave absorbing layer 23 may be provided at one side of the first lower microwave absorbing layer 21. The third lower microwave absorbing layer 25 may be provided at the other side of the first lower microwave absorbing layer 21. The first lower microwave absorbing layer 21, the second lower microwave absorbing layer 23, and the third lower microwave absorbing layer 25 may have the first heat conversion rate 1, the second heat conversion rate 2, and the third heat conversion rate 3, respectively.

The thermal interface layers 30 and the temperature measuring layers 40 may be provided below the first lower microwave absorbing layer 21, the second lower microwave absorbing layer 23, and the third lower microwave absorbing layer 25.

According to one example, the upper microwave absorbing layers 24 may include a first upper microwave absorbing layer 26, a second upper microwave absorbing layer 27, and a third upper microwave absorbing layer 28.

The first upper microwave absorbing layer 26 may be provided between the second upper microwave absorbing layer 27 and the third upper microwave absorbing layer 28. The second upper microwave absorbing layer 27 may be provided at one side of the first upper microwave absorbing layer 26. The third upper microwave absorbing layer 28 may be provided at one side of the first upper microwave absorbing layer 26. The first upper microwave absorbing layer 26, the second upper microwave absorbing layer 27, and the third upper microwave absorbing layer 28 may have the first heat conversion rate 1, the second heat conversion rate 2, and the third heat conversion rate 3, respectively.

Thermal interface layers 30 and the temperature measuring layers 40 may be provided on the first upper microwave absorbing layer 26, the second upper microwave absorbing layer 27, and the third upper microwave absorbing layer 28.

The first lower microwave absorbing layer 21 and the first upper microwave absorbing layer 26 may heat the semiconductor packaging 70 at the first heat conversion rate 1.

The second lower microwave absorbing layer 23 and the second upper microwave absorbing layer 27 may heat the semiconductor packaging 70 at the second heat conversion rate 2. Each of the second lower microwave absorbing layer 23 and the second upper microwave absorbing layer 27 may heat the semiconductor packaging 70 at a temperature less than that of each of the first lower microwave absorbing layer 21 and the first upper microwave absorbing layer 26.

The third lower microwave absorbing layer 25 and the third upper microwave absorbing layer 28 may heat the semiconductor packaging 70 at the third thermal conversion rate 3. Each of the third lower microwave absorbing layer 25 and the third upper microwave absorbing layer 28 may heat the semiconductor packaging 70 at a temperature less than that of the second lower microwave absorbing layer 23 and the second upper microwave absorbing layer 27.

Hereinafter, a method for manufacturing a semiconductor packaging 70 using a microwave heating device 100 according to the inventive concept will be described.

Figure 6:
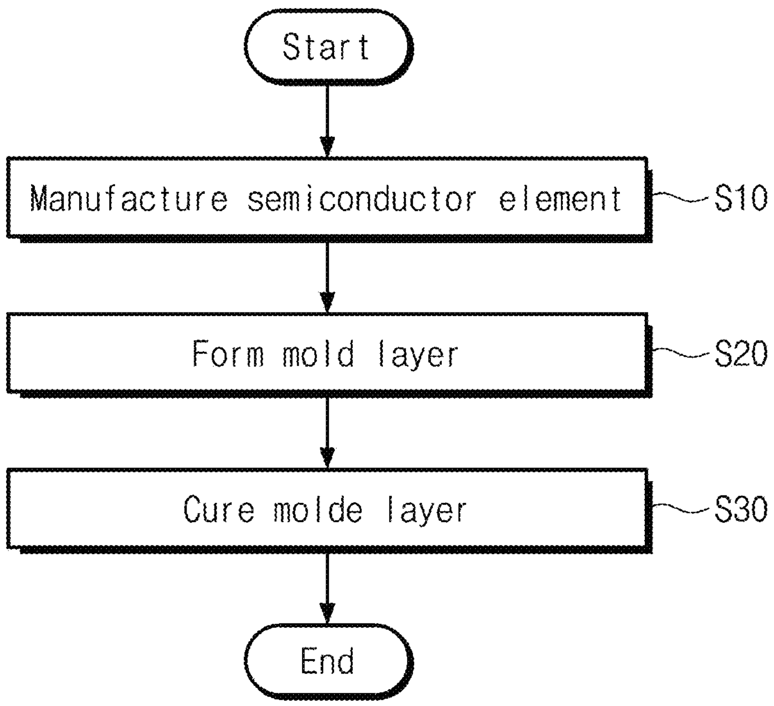
FIG. 6 is a flowchart illustrating a method for manufacturing a semiconductor packaging according to the inventive concept.

FIG. 6 is a flowchart illustrating a method for manufacturing a semiconductor packaging 70 according to the inventive concept.

Referring to FIGS. 5 and 6, a semiconductor element 72 is manufactured (S10). The semiconductor element 72 may be manufactured through unit processes of a thin film deposition process, a photolithography process, an etching process, and a cleaning process. The semiconductor element 72 may be individually separated from a substrate through a sawing process. The semiconductor element 72 may include an application process (AP) chip, a memory chip, or a laminated structure thereof.

Next, a mold layer 74 is formed on an outer circumferential surface of the semiconductor element 72 (S20). The mold layer 74 may include a thermosetting polymer compound. Specifically, the mold layer 74 may include an epoxy molding compound (EMC), an underfill, a molded underfill (MUF), and the like. Although not shown, the mold layer 74 may be formed between a laminated surface in the case of a portion of top and bottom surfaces or the laminated structure.

Then, the mold layer 74 is heated to be cured using a microwave heating device 100 according to the inventive concept (S30). The mold layer 74 may be cured at a temperature of about 50° C. to about 300° C. The microwave heating device 100 according to the inventive concept may be configured in the same manner as in FIGS. 1 to 3 and 5.

Although not shown, the microwave heating apparatus 100 according to the inventive concept may not only cure the mold layer 74 of the mold layer 74 of the semiconductor packaging 70, but also perform redistribution layer (RDL) curing, insulating material curing, dielectric material curing, non-conductive paste (NCP) curing, non-conductive film (NCF) curing, solder bonding, flip chip bonding such as Cu—Cu bonding, etc., ultra-high temperature heat treatment process for an SiC power semiconductor device, printed circuit board (PCB) heat treatment, etc. As described above, the typical thermal process may be replaced with a low-carbon high-quality microwave process.

Figure 7:
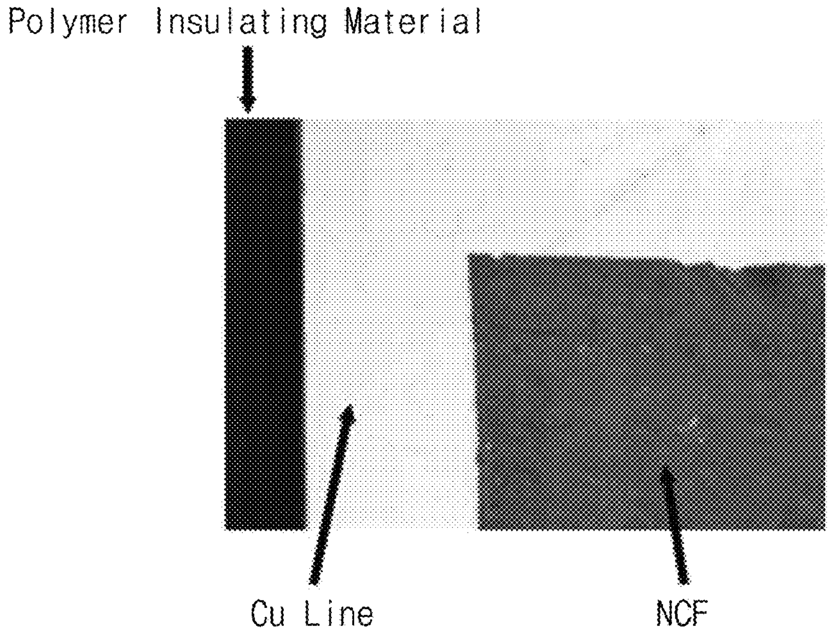
FIG. 7 is a photograph illustrating an example in which a microwave heating device is applied to a semiconductor packaging process using microwaves according to the inventive concept.
Figure 8:
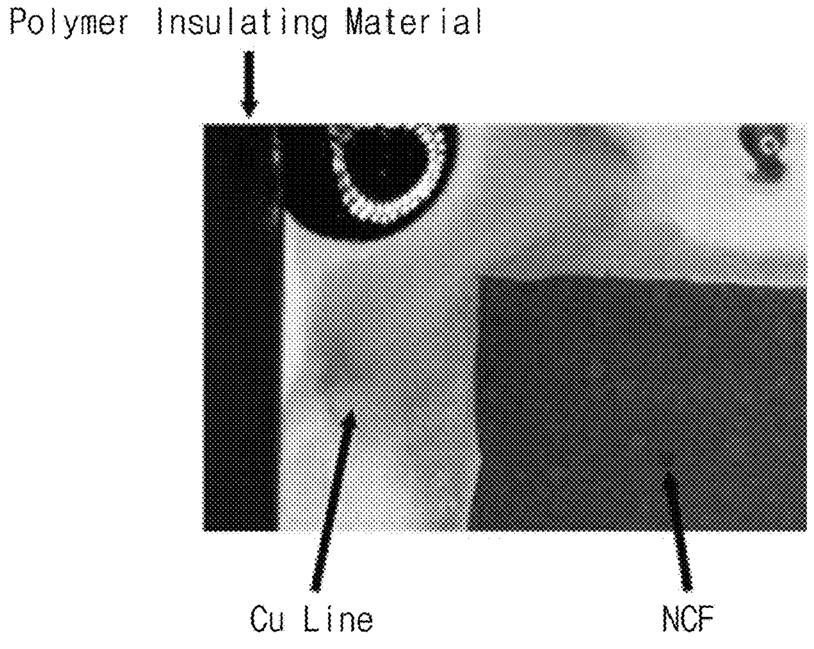
FIG. 8 is a photograph illustrating an example in which the microwave heating device is not applied to the semiconductor packaging process using the microwaves according to the inventive concept.

FIG. 7 is a sample photograph after curing an NCF film formed on the PCB at a temperature of about 180° C. for about 5 minutes using the microwave heating device 100 illustrated in FIG. 3. Here, total energy of microwaves generated by a microwave generator 10 was about 34,580 J. FIG. 8 is a sample photograph after curing the NCF film formed on the PCB at a temperature of about 180° C. for about 5 minutes in a state in which a microwave absorbing layer 20, a thermal interface layer 30, and a temperature measuring layer 40 of the microwave heating device 100 of FIG. 3 are removed. Here, total energy of the microwaves generated by the microwave generator 10 was about 60,260 J.

When using the microwave heating device 100 according to the inventive concept through an experimental comparison of FIGS. 7 and 8, it was confirmed that microwave energy generated by the microwave generator 10 was reduced by about 42.6%, and it may be confirmed that deterioration of a surrounding polymeric insulating material is effectively blocked by blocking an arcing phenomenon of a copper line, which is caused by microwaves.

As described above, the microwave heating device according to the embodiment of the inventive concept may effectively heat the semiconductor packaging using the microwave source and the microwave absorbing layer.

Although the embodiment of the inventive concept is described with reference to the accompanying drawings, those with ordinary skill in the technical field of the inventive concept pertains will be understood that the present disclosure can be carried out in other specific forms without changing the technical idea or essential features. Thus, the above-disclosed embodiments are to be considered illustrative and not restrictive.

What is claimed is:

1. A microwave heating device comprising:

a microwave generator configured to generate microwaves;

a microwave absorbing layer configured to receive the microwaves so as to be heated;

a temperature measuring layer provided on the microwave absorbing layer;

a sensor provided on and inside the temperature measuring layer to detect a temperature of the temperature measuring layer; and a controller connected to the sensor and the microwave generator to determine the temperature of the microwave absorbing layer using a detection signal of the sensor, the controller being configured to control power of the microwaves provided from the microwave generator based on the temperature of the microwave absorbing layer.

2. The microwave heating device of claim 1, further comprising a thermal interface layer between the microwave absorbing layer and the temperature measuring layer.

3. The microwave heating device of claim 2, wherein the thermal interface layer comprises a thermal interface material.

4. The microwave heating device of claim 1, wherein the microwave absorbing layer comprises:

a highly heat-resistant polymer; and microwave absorbing particles within the highly heat-resistant polymer.

5. The microwave heating device of claim 4, wherein the microwave absorbing layer further comprises:

a microwave-transmissive container configured to store the microwave absorbing particles; and a highly heat-resistant resin provided within the microwave-transmissive container.

6. The microwave heating device of claim 4, wherein the microwave absorbing particles comprise graphene, SWCNT, MWCNT, fullerene, BN, or BNNT.

7. The microwave heating device of claim 1, wherein the microwave absorbing layer comprises a microwave metamaterial absorber.

8. The microwave heating device of claim 1, wherein the microwave absorbing layer comprises:

a lower microwave absorbing layer; and an upper microwave absorbing layer on the lower microwave absorbing layer.

9. The microwave heating device of claim 8, wherein the lower microwave absorbing layer comprises:

a first lower microwave absorbing layer;

a second lower microwave absorbing layer provided at one side of the first lower microwave absorbing layer, the second lower microwave absorbing layer having a thermal conversion rate different from a thermal conversion rate of the first lower microwave absorbing layer; and a third lower microwave absorbing layer provided at the other side of the first lower microwave absorbing layer, the third lower microwave absorbing layer having a thermal conversion rate different from each of the thermal conversion rates of the first and second lower microwave absorbing layers.

10. The microwave heating device of claim 9, wherein the upper microwave absorbing layer comprises:

a first upper microwave absorbing layer;

a second upper microwave absorbing layer provided at one side of the first lower microwave absorbing layer, the second upper microwave absorbing layer having a thermal conversion rate different from a thermal conversion rate of the first upper microwave absorbing layer; and a third upper microwave absorbing layer provided at the other side of the first lower microwave absorbing layer, the third upper microwave absorbing layer having a thermal conversion rate different from each of the thermal conversion rates of the first and second upper microwave absorbing layers.

11. A method for manufacturing a semiconductor packaging, the method comprising:

manufacturing a semiconductor element; and heating the semiconductor element using a microwave heating device, wherein the microwave heating device comprises:

a microwave generator configured to generate microwaves;

a microwave absorbing layer configured to receive the microwaves so as to be heated;

a temperature measuring layer provided on the microwave absorbing layer;

a sensor provided on and inside the temperature measuring layer to detect a temperature of the temperature measuring layer; and a controller connected to the sensor and the microwave generator to determine the temperature of the microwave absorbing layer using a detection signal of the sensor, the controller being configured to control power of the microwaves provided from the microwave generator based on the temperature of the microwave absorbing layer.

12. The method of claim 11, further comprising forming a mold layer on an outer circumferential surface of the semiconductor element, wherein the heating of the semiconductor element comprises curing the mold layer.

* * * * *